United States Patent
Agarwal et al.

[11] Patent Number: 6,028,878
[45] Date of Patent: Feb. 22, 2000

[54] LASER DIODE ARRAY WITH BUILT-IN CURRENT AND VOLTAGE SURGE PROTECTION

[75] Inventors: Rajiv Agarwal, Calcutta, India; Michael Ung, Tucson, Ariz.

[73] Assignee: Opto Power Corporation, Tucson, Ariz.

[21] Appl. No.: 08/990,347

[22] Filed: Dec. 15, 1997

Related U.S. Application Data

[63] Continuation-in-part of application No. 08/591,983, Jan. 29, 1996, abandoned.

[51] Int. Cl.[7] .................................................... H01S 3/19
[52] U.S. Cl. ........................... 372/50; 372/38; 372/43
[58] Field of Search ............................. 385/38, 43, 44, 385/45, 46, 50

[56] References Cited

U.S. PATENT DOCUMENTS

| | | | |
|---|---|---|---|
| 5,412,675 | 5/1995 | Odagawa | 372/29 |
| 5,550,852 | 8/1996 | Patel et al. | 372/33 |
| 5,636,234 | 6/1997 | Takagi | 372/43 |

*Primary Examiner*—Brian Healy
*Attorney, Agent, or Firm*—Herbert M. Shapiro

[57] ABSTRACT

Protection from current and voltage spikes is provided for a laser array by attaching a reverse diode laser array to shared contact pads before the first laser array is bonded to those pads. The arrangement provides for surge protection even during fabrication of the laser package where device failure results from power surges before surge protection circuitry is in place. Surge protection is afforded by having a reverse diode of the reverse diode array electrically in parallel with a corresponding laser diode of the protected array when activated.

5 Claims, 2 Drawing Sheets

LASER DIODE ARRAY WITH BUILT-IN CURRENT AND VOLTAGE SURGE PROTECTION

REFERENCE TO RELATED APPLICATIONS

The present application is a continuation-in-part of application Ser. No. 08/591,983 filed Jan. 29, 1996, now abandoned, and assigned to the assignee of the present application.

FIELD OF THE INVENTION

This invention relates to laser arrays and, more particularly, to laser arrays which include on-board surge protection.

BACKGROUND OF THE INVENTION

It is well known that laser devices, like all semiconductor devices, are subject to current and voltage spikes (surges) which occur often in use. Such spikes can be caused by electrostatic forces, power supply malfunctions, etc. In semiconductor lasers, such spikes cause degradation of performance and are known to occur in the reverse bias mode.

Copending application, Ser. No. 08/386,413, filed Feb. 10, 1995 and assigned to the assignee of the present application (now U.S. Pat. No. 5,550,852, issued Aug. 27, 1996) discloses the use of a second laser of opposite conductivity type from that of a first laser and fabricated along with the first laser diode for surge protection. The second diode is arranged electrically in parallel with the first diode and is operative in the reverse diode mode. The use of the second diode in this mode avoids damage even during manufacture and has been found to increase yields significantly.

BRIEF DESCRIPTION OF THE INVENTION

In accordance with the principles of the present invention, surge protection for a laser array, such as a linear array or laser bar, is provided by fabricating a reverse diode laser bar along with the fabrication of a laser bar to be protected. The laser bar and the protector (reverse diode) bar are soldered onto contact pads such that corresponding diodes in each array are soldered to corresponding pads. The contact pads are formed as strips on an electrically isolating layer on the surface of a heat sink and corresponding diodes of the two diode arrays are bonded to corresponding contact strips. Whenever a diode of the array is selected, the selecting voltage is operative to reverse bias the corresponding diode of the protector array.

DETAILED DESCRIPTION OF ILLUSTRATIVE EMBODIMENTS OF THE INVENTION

Figure 1:
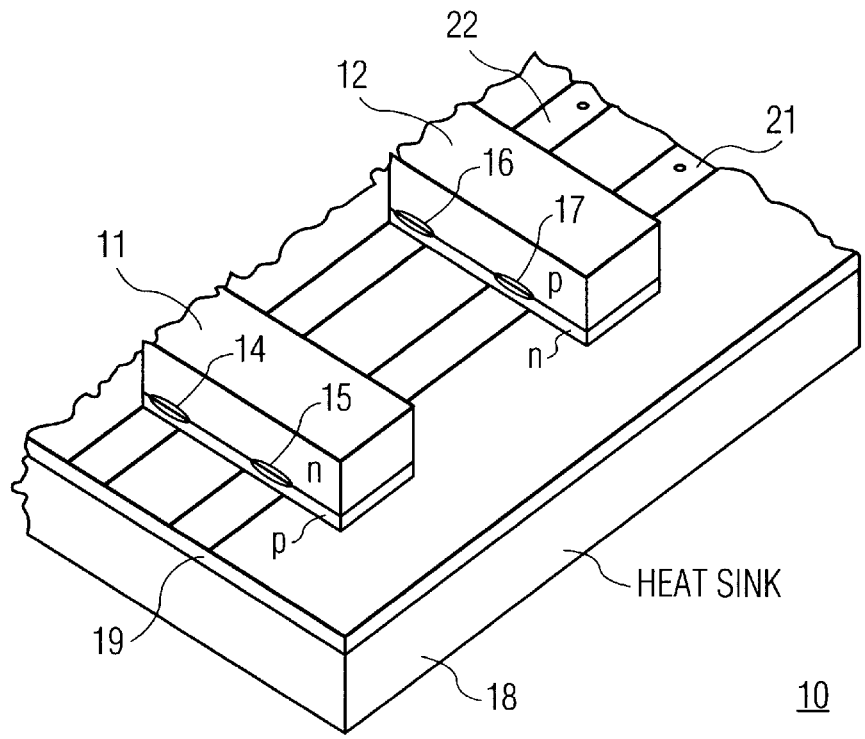
FIG. 1 is a schematic perspective view of a laser bar and an associated reverse bias protector bar in accordance with the principles of this invention.

FIG. 1 shows an arrangement 10 including first and second laser bars 11 and 12 manufactured, preferably, simultaneously. The bars are of opposite conductivity type, the second serving as a surge protector for the first. Such laser bars are available commercially and the manufacture thereof is well understood and not discussed further herein. But, in accordance with the principles of this invention, the bars include a like number of diodes and the corresponding diodes of the two bars are arranged electrically in parallel such that a selecting voltage for activating a diode of the first array reverse biases the corresponding diode of the second array.

FIG. 1 shows a perspective view of an illustrative two diode arrangement for first and second laser bars 11 and 12. Practical embodiments, of course, including a number of diodes greater than two. The diodes are designated 14 and 15 for laser bar 11 and 16 and 17 for laser bar 12 in FIG. 1. In laser bars with greater numbers of diodes, the structure of FIG. 1, shown broken, would continue to the left as viewed with the illustrative structure repeating.

The laser and surge protector bars are mounted on a heat sink 18. Heat sink 18 includes an electrically-insulating layer 19 on its surface. Isolation layer 19 comprises, for example, an aluminum oxide layer ten mils thick. Electrical contact pads 21, 22, . . . N for N diode bars are formed in parallel strips and the bars are soldered to the strips such that corresponding diodes in the bars are bonded to the corresponding strips.

Figure 2:
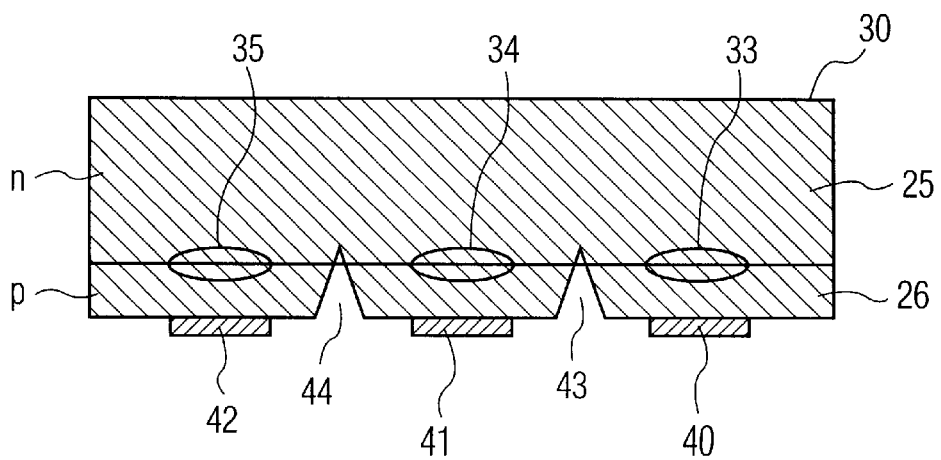
FIGS. 2 and 3 are enlarged cross sectional views of a laser bar and a protector laser bar of FIG. 1, respectively.
Figure 3:
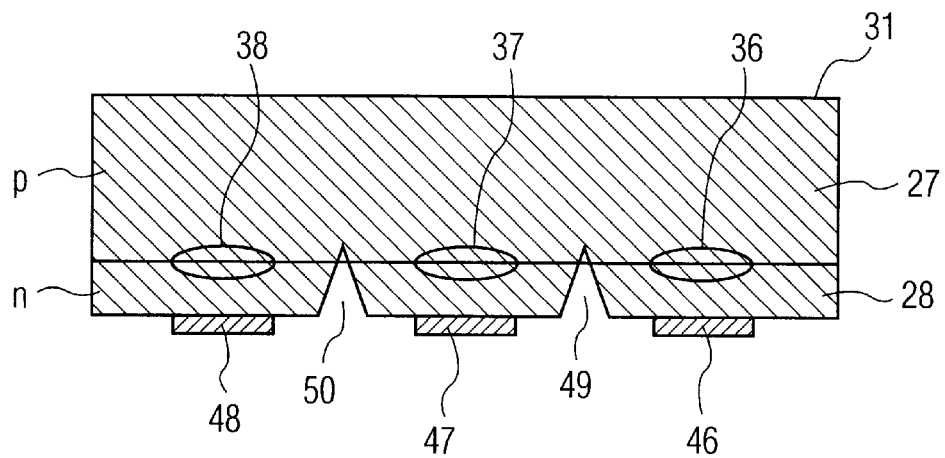

It is important to note that laser bar 11 has an n-type substrate 25 with a p-type surface layer 26 facing downwards while laser bar 12 has a p-type substrate 27 with an n-type surface layer 28 as shown in FIGS. 2 and 3.

As shown in FIGS. 2 and 3, an arrangement in accordance with the principles of this invention includes three diodes 33, 34, and 35 for a laser bar 30 and includes diodes 36, 37, and 38 for a surge protector bar 31, where an oval in the figure represents the emitting surface of a diode. Electrode contacts for the diodes are represented by rectangles 40, 41, and 42, respectively, in FIG. 2 which correspond to the contact strips (21 and 22) of FIG. 1. The diodes are shown separated by grooves 43 and 44 which penetrate through the surface regions of the laser bars and provide electrical isolation between the diodes.

Figure 4:
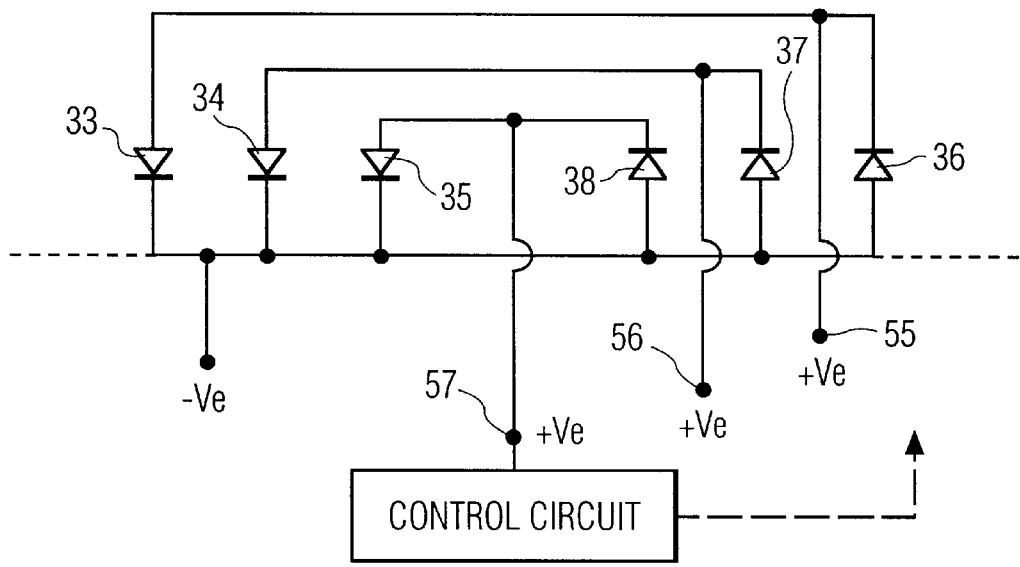
FIG. 4 is an equivalent circuit schematic for the arrangements of FIGS. 1, 2, and 3.

FIG. 4 shows the equivalent electrical circuit for the arrangement of FIGS. 2 and 3 mounted as shown in FIG. 1. The diodes in FIG. 4 are designated as they are in FIGS. 2 and 3. All the diodes are connected electrically between +Ve and −Ve where diode pair 33 and 36, diode pair 34 and 37 and diode pair 35 and 38 are connected between +Ve at 55, 56, and 57 respectively and −Ve such that the diodes 33, 34, and 35 are forward biased and diodes 36, 37, and 38 are reverse biased when activated, as shown.

The diodes 33, 34, and 35 can be addressed individually in the organization of FIGS. 1, 2, and 3.

Illustratively, laser bar 30 comprises gallium arsenide (n-type) substrate (25) with an aluminum gallium arsenide p-type layer (26). The diodes are on 8 mil centers and the bar is 40 mils by 4 mils in cross section.

Laser diode arrays are in commercial use and the fabrication thereof is well understood as mentioned hereinbefore. U.S. Pat. Ser. No. 5,081,633, issued Jan. 14, 1992, and entitled "Semiconductor Laser Diode" discloses one suitable manufacturing process. U.S. Pat. No. 5,107,091, issued Apr. 21, 1992, and entitled "Laser Diode Array Mounting Module" discloses a suitable mounting module for a laser array.

What is claimed is:

1. Apparatus comprising a solid state laser device including first and second laser bars of opposite conductivity tapes, each of said first and second laser bars including N laser diodes therein, said apparatus also including a heat sink having an electrically-insulating surface layer thereon, said electrically-insulating surface layer having thereon N contact strips, corresponding diodes of said first and second laser bars being electrically connected to the same one of said contact strips, said apparatus also including an electrical circuit for selectively impressing a voltage across said corresponding diodes of said first and second diode arrays for simultaneously forward biasing a first diode of said first bar and reverse biasing the corresponding diode of said second bar—wherein said first laser bar has an n-type substrate and a p-type surface layer, said electrical insulating layer comprises aluminum oxide, and wherein said first and second laser bars include grooves therein through said surface layers for electrically isolating the diodes therein from one another.

2. Apparatus as in claim 1 wherein said substrate of said first laser bar comprises gallium arsenide and said p-type surface layer comprises aluminum gallium arsenide.

3. Apparatus as in claim 1 also including control circuitry for activating said diodes of said first and second laser bars selectively.

4. Apparatus as in claim 2 also including control circuitry for activating said diodes of said first and second laser bars selectively.

5. Apparatus as in claim 2 wherein said second laser bar has a substrate of n-type gallium arsenide and a surface layer of p-type gallium arsenide.

* * * * *